(12) United States Patent
He et al.

(10) Patent No.: US 11,244,089 B2
(45) Date of Patent: Feb. 8, 2022

(54) CAM CURVE DESIGN METHOD FOR CAP SCREWING MACHINE BASED ON MULTI-OBJECTIVE METHOD

(71) Applicant: Jiangnan University, Wuxi (CN)

(72) Inventors: Xueming He, Wuxi (CN); Jia Wu, Wuxi (CN); Zhenchao Liu, Wuxi (CN); Haigang Fan, Wuxi (CN); Hainan Huang, Wuxi (CN)

(73) Assignee: Jiangnan University, Wuxi (CN)

( * ) Notice: Subject to any disclaimer, the term of this patent is extended or adjusted under 35 U.S.C. 154(b) by 456 days.

(21) Appl. No.: 16/256,683

(22) Filed: Jan. 24, 2019

(65) Prior Publication Data

US 2019/0188358 A1 Jun. 20, 2019

Related U.S. Application Data

(63) Continuation of application No. PCT/CN2017/119424, filed on Dec. 28, 2017.

(30) Foreign Application Priority Data

Dec. 19, 2017 (CN) .......................... 201711370823.3

(51) Int. Cl.
*G06F 30/17* (2020.01)
*G06F 17/11* (2006.01)
(Continued)

(52) U.S. Cl.
CPC ............ *G06F 30/17* (2020.01); *B67B 3/2033* (2013.01); *G06F 17/11* (2013.01); *B67B 3/00* (2013.01); *F16H 53/025* (2013.01)

(58) Field of Classification Search
CPC ....... G06F 30/17; G06F 17/11; B67B 3/2033; B67B 3/00; F16H 53/025
(Continued)

(56) References Cited

U.S. PATENT DOCUMENTS 5,986,190 A * 11/1999 Wolff .................... G10D 3/153
84/297 R
2003/0094151 A1* 5/2003 Yasui ....................... F01L 1/34
123/90.17

(Continued)

FOREIGN PATENT DOCUMENTS

| CN | 103268378 A | 8/2013 |
|---|---|---|
| CN | 106844875 A | 6/2017 |

OTHER PUBLICATIONS

Bin Liu et. al., Design of main components in high speed capper. Coal Technology, vol. 31, No. 10, Oct. 2012. p. 21-22.

*Primary Examiner* — Juan C Ochoa
(74) *Attorney, Agent, or Firm* — IPro, PLLC; Na Xu (57) ABSTRACT

Disclosed is a cam curve design method for a cap screwing machine based on a multi-objective method, belonging to the technical field of cap screwing machine cam design. The present disclosure is to solve the problem that the conventional method for redesigning the cam curve cannot optimize the parameters according to the degree of importance such that the operating stability of a cam mechanism is poor. The method comprises: acquiring key point data determined for realizing the functions of a cam of the cap screwing machine; performing dimensionless processing on the key point data to obtain a dimensionless time T and a dimensionless displacement S; writing an n-order polynomial fitting cam curve displacement function, manually interpolating local control points, and obtaining a polynomial fitting cam curve expression and chart in combination with the constraints of key point displacement by using a least squares method; and selecting cam curve optimization objectives and setting weight coefficients to construct an optimized cam curve. The present disclosure is used for the design of a cam curve.

3 Claims, 13 Drawing Sheets

(51) Int. Cl.
    *F16H 53/02*     (2006.01)
    *B67B 3/20*     (2006.01)
    *B67B 3/00*     (2006.01)

(58) Field of Classification Search
    USPC .......................................................... 703/2
    See application file for complete search history.

(56) References Cited

U.S. PATENT DOCUMENTS

| | | |
|---|---|---|
| 2009/0118840 A1 | 5/2009 | Krauskopf et al. |
| 2014/0190775 A1* | 7/2014 | Short ................. B62L 1/16 |
| | | 188/24.19 |

* cited by examiner

CAM CURVE DESIGN METHOD FOR CAP SCREWING MACHINE BASED ON MULTI-OBJECTIVE METHOD

TECHNICAL FIELD

The present disclosure relates to a cam curve design method for a cap screwing machine based on a multi-objective method, belonging to the technical field of cap screwing machine cam design.

BACKGROUND

A cam mechanism almost can complete all kinds of variable motions, can adjust the speed as needed, and is high in precision and low in cost, so the cam mechanism is applied to many modern machines. With continuous development of the society, people's requirements for the efficiency, precision, reliability and the like of various types of automatic machinery are also constantly improved. In addition, as the rotational speed of a cam is constantly improved, in order that the cam can run more smoothly and efficiently, engineers have gradually began to pay attention to the dynamic characteristics of the cam mechanism, and novel cam mechanisms are also developed very rapidly toward the combination of dynamics and kinematics. It has become a very important task to design a cam mechanism to study a general curve with better dynamic and kinematic performance.

The kinematic and dynamic performance of cam mechanisms can be improved by many methods, and studying the cam curve of the cam mechanism is the most effective way to improve kinematic and dynamic performance thereof. The conventional method of studying the cam curve is to combine some motion curves commonly used at present to meet the actual motion requirements of the cam, but the motion curve formed by combination is not continuous at a high-order derivative, so the requirements of continuously increasing speed of the cam mechanism cannot be met.

At present, the design method for the cam curve of a cap screwing machine is to connect key points when the cap screwing machine completes relevant actions by a straight line and chamfer the junctions of the key points. This method can achieve continuous speed of the cam curve, but when the cam is running at a high speed, due to flexible impact, the dynamic stress of members is relatively large, and the cap screwing machine makes loud noise on site and is easy to wear and low in operating efficiency. Accordingly, the cam curve is redesigned by polynomial fitting, k-order harmonic function and other methods, then the characteristic parameters of the obtained cam curve, such as maximum speed $V_{max}$, maximum acceleration $A_{max}$, maximum jerk $J_{max}$ and maximum jump $Q_{max}$, are all lower than those of the original cam curve to a certain degree, the continuity and derivability thereof are improved therewith, and the kinematic and dynamic performance are greatly improved. However, the local displacement control conditions are excessive when the cam curve is designed by using a polynomial, and polynomial interpolation may cause too high polynomial power, which is not conducive to machining. In the design, the characteristic parameter values of the cam curve are usually expected to be simultaneously optimal, that is, the characteristic values are as small as possible, which is difficult to realize. Therefore, this method for redesigning the cam curve cannot balance these parameters in advance, but can only focus on the items of small characteristic values for different purposes and appropriately loosen restrictions on other characteristic parameters such that all parameter characteristic values achieve relatively balanced optimization.

SUMMARY

The present disclosure provides a cam curve design method for a cap screwing machine based on a multi-objective method in order to solve the problem that the conventional method for redesigning a cam curve cannot optimize parameters according to the degree of importance such that the operating stability of a cam mechanism is poor.

A cam curve design method for a cap screwing machine based on a multi-objective method according to the present disclosure, comprising the following steps:

step 1: acquiring key point data determined for realizing the functions of a cam of the cap screwing machine;

step 2: performing dimensionless processing on the key point data to obtain dimensionless time T and dimensionless displacement S;

step 3: writing an n-order polynomial fitting cam curve displacement function, comparing a fitting error with a set allowable error, and if the comparison result is greater than a set threshold, manually interpolating local control points till the comparison result is within the set threshold; then, obtaining a polynomial fitting cam curve expression and chart in combination with the constraints of key point displacement by using a least squares method; n being a positive integer; and step 4: selecting cam curve optimization objectives and setting weight coefficients to construct an optimized cam curve.

Another cam curve design method for a cap screwing machine based on a multi-objective method according to the present disclosure, comprising the following steps:

step 1: acquiring key point data determined for realizing the functions of a cam of the cap screwing machine;

step 2: performing dimensionless processing on the key point data to obtain dimensionless time T and dimensionless displacement S;

step 3: writing a cam curve fitting program, determining the order of k based on an improved cam curve displacement function of a k-order harmonic function, adding local control points, fitting key points and the local control points by using a sum formula of a least squares method, and solving a cam curve expression and a cam curve chart; and step 4: selecting cam curve optimization objectives and setting weight coefficients to construct an optimized cam curve.

Advantages of the present disclosure: Compared with the conventional cam curve design method and polynomial interpolation design method for the cap screwing machine, the polynomial fitting method controls the polynomial power from the beginning, and can reduce the machining difficulty while satisfying the condition of local displacement control; a harmonic function method can be infinitely derived, and the derived function is a harmonic function, which can effectively ensure the continuity of the cam curve and improve the operating efficiency of the mechanism. After multi-objective optimization on the two curves, not only can their excellent performance be guaranteed, but also the design process is more realistic according to the requirements, so that the performance parameters can be improved more reasonably.

Compared with the G1 continuity of cam curves obtained by the conventional design methods, the cam curve after multi-objective optimization has G2, G3 and even G4 continuity, better smoothness and smaller amplitude of acceleration fluctuation, can effectively alleviate the noise and vibration of the cam mechanism, and enable the dynamic performance to be improved, wherein G1 is tangent continuity, G2 is curvature continuity, G3 is curvature change rate continuity, and G4 is change rate continuity of curvature change rate.

DETAILED DESCRIPTION

Example 1

The following describes the present embodiment in combination with FIG. 1 to FIG. 20. A cam curve design method for a cap screwing machine based on a multi-objective method according to the present embodiment includes the following steps:

step 1: acquiring key point data determined for realizing the functions of a cam of the cap screwing machine;

step 2: performing dimensionless processing on the key point data to obtain dimensionless time T and dimensionless displacement S;

step 3: writing an n-order polynomial fitting cam curve displacement function, comparing a fitting error with a set allowable error, and if the comparison result is greater than a set threshold, manually interpolating local control points till the comparison result is within the set threshold; then, obtaining a polynomial fitting cam curve expression and chart in combination with the constraints of key point displacement by using a least squares method; n being a positive integer; and step 4: selecting cam curve optimization objectives and setting weight coefficients to construct an optimized cam curve.

In step 1, the data that a cam follower of the cap screwing machine arrives at corresponding displacement points at corresponding angles is used as key points, and these key points generally support the cap grasping, bottle entering and cap screwing functions of the cap screwing machine. In step 3, a polynomial fitting program is written through MATLAB, and the n-order polynomial fitting cam curve displacement function can be expressed as: $S=C_0+C_1 T+\ldots+C_n T^n$ (the present disclosure mainly uses 5-order, 6-order or 7-order polynomial). In order to control the fitting error within a certain range, an allowable error of design is preset when programming is conducted. When the fitting error differs from the set allowable error greatly, i.e., the fitting error exceeds the set threshold, local control points can be manually interpolated to reduce the error and effectively control the shape of the cam curve, so that the curve trend is more in accordance with the actual situation. Then, the cam curve expression and chart designed by a polynomial fitting method are obtained in combination with the constraints of key point displacement by using a least squares method, wherein $C_0$ is an initial coefficient, $C_1$ is a 1st coefficient, and $C_n$ is an $n^{th}$ coefficient.

Example 2

The following describes the present embodiment in combination with FIG. 1 to FIG. 20. A cam curve design method for a cap screwing machine based on a multi-objective method according to the present embodiment includes the following steps:

step 1: acquiring key point data determined for realizing the functions of a cam of the cap screwing machine;

step 2: performing dimensionless processing on the key point data to obtain dimensionless time T and dimensionless displacement S;

step 3: writing a cam curve fitting program, determining the order of k based on an improved cam curve displacement function of a k-order harmonic function, adding local control points, fitting key points and the local control points by using a sum formula of a least squares method, and solving a cam curve expression and a cam curve chart; and step 4: selecting cam curve optimization objectives and setting weight coefficients to construct an optimized cam curve.

The k is more than or equal to 2.

In step 1, the data that a cam follower of the cap screwing machine arrives at corresponding displacement points at corresponding angles is used as key points, and these key points generally support the cap grasping, bottle entering and cap screwing functions of the cap screwing machine. In step 3, a cam curve fitting program is written through MATLAB, and the improved cam curve displacement function of the k-order harmonic function can be expressed as:

$$S = \sum_{n=1}^{k} c_n \sin(\omega_n T + \varphi_n).$$

For the selection of k, if the k value is smaller, the possibility of resonance of the mechanism is smaller. When k=1, i.e. first order, the performance of the first-order curve is the same as the motion law of a cycloid curve or a simple harmonic curve, so k is generally rounded from 2. At the same time, in order to control the local shape and well adjust the cam curve, a series of local control points are added, key points and local control points are fitted by using a sum formula of a least squares method to obtain the values of $c_n$, $\omega_n$ and $\varphi_n$, and then a cam curve expression and a cam curve chart are obtained. In the formula, $c_n$ is an amplitude, $\omega_n$ is an angular frequency, and q is a phase angle.

A multi-objective optimization method is used to optimize the cam curve of polynomial fitting or harmonic function fitting, so that these parameter values can be balanced in advance and the importance thereof can be set according to the actual conditions and requirements, and these parameter values can be optimized to different degrees, and the fluctuation of the optimized characteristic values can be reduced, which is very beneficial to the stability of the cam mechanism during operation and effectively ensures the operating precision of the mechanism.

When multi-objective optimization is used, the optimized objectives usually constrain one another, so that all the objectives cannot be optimized together. Accordingly, when the multi-objective optimization is used to solve practical problems, weights corresponding to the importance of respective objectives are usually assigned according to the different importance of the objectives, and the more important objectives are regarded as main optimization objectives. Thus, in order to achieve relatively excellent kinematic and dynamic characteristics, the optimization objectives need to be balanced, so that the important objectives are optimal, and other objectives are preferable. The multi-objective optimization function is generally written as:

$$\begin{cases} \min(f_1(x), f_2(x), \cdots, f_p(x))^T, p > 1, x > E^p \\ \text{s.t } g_i(x) \geq 0, i = 1, 2, \cdots, m \\ h_i(x) = 0, i = 1, 2, \cdots, l \end{cases},$$

In the formula, $f_p(x)$ is a single objective function that needs to be optimized, s.t $g_i(x){>}0$ is a multi-objective optimization inequality constraint, and s.t $h_i(x){=}0$ is an equality constraint. $h_i(x)$ is an equality constraint equation, m is a positive integer, and I is a positive integer.

When a linear weighting method is used to optimize a few objectives, p objective functions $f_j(x)$ are usually endowed with certain weight coefficients $\lambda_1$ according to different importance of the objectives and the degree of importance, and then a new objective function is constructed, that is, all the objective functions are weighted and summed to obtain the optimal value of the new objective function. Its mathematical model can be written as:

$$\begin{cases} \min \sum_{j=1}^{p} \lambda_j f_j(x), p > 1, x > E^p \\ \text{s.t } g_i(x) \geq 0, i = 1, 2, \cdots, m \\ h_i(x) = 0, i = 1, 2, \ldots, l \end{cases}.$$

In the above two embodiments, the method of optimizing characteristic parameter values in step 4 is: optimizing the cam curve based on a multi-objective optimization method. First optimization objectives are determined: the characteristic values of maximum velocity $V_{max}$, maximum acceleration $A_{max}$, maximum jerk $J_{max}$, maximum jump $Q_{max}$ and dynamic load torque characteristic parameter $AV_{max}$ are compared, the comprehensive performance of the cam curve is distinguished by experience, and the maximum velocity $V_{max}$, maximum acceleration $A_{max}$, maximum jerk $J_{max}$, maximum jump $Q_{max}$ and dynamic load torque characteristic parameter $AV_{max}$ are selected as cam curve optimization objectives. Then a weight coefficient is set: a weight coefficient $\lambda_1$ is added to the objectives of the maximum velocity $V_{max}$, maximum acceleration $A_{max}$, maximum jerk $J_{max}$, maximum jump $Q_{max}$ and dynamic load torque characteristic parameter $AV_{max}$ by using a linear weighting method, and then summing is conducted. In a specific application, the weights are changed according to relevant design requirements.

Finally, the obtained cam curve charts obtained by optimization can be compared to observe the maximum speed value, maximum acceleration value, maximum jerk value, maximum jump value and the like as well as the fluctuation thereof so as to verify the optimization effect.

Aiming at the defects caused by the conventional design method of connecting key points with a straight line and chamfering the junctions when a cam curve of a cap screwing machine is designed, the present disclosure optimizes the cam curve in a multi-objective manner based on polynomial fitting or harmonic function fitting on the premise that the key points determined for realizing the functions of the conventional cam mechanism are reserved, thereby improving the derivability and continuity of the cam curve at the key points, and effectively solving the problems of impact, wear, fatigue damage, noise and the like of the cam mechanism during operation.

The present disclosure adopts a multi-objective optimization method to design a cam curve of a cap screwing machine. First, each key point (generally expressed as certain displacement to be achieved for an angle) determined to complete a cap screwing function of the cap screwing machine is obtained. Second, in order to avoid the influence of dimensions, the expression of each key point is converted into a time-displacement relationship, and then dimensionless processing is performed on the time and the displacement. Finally, local control points are appropriately added on the basis of controlling the shape and error of the curve, key points and local control points are fitted by the multi-objective optimization manner, and a cam curve expression and a cam curve chart are output.

In order to verify the validity of the method according to the present disclosure, the optimized cam curve can be compared with cam curves designed by single polynomial fitting and harmonic function fitting to select an optimal cam curve design method.

Figure 1:
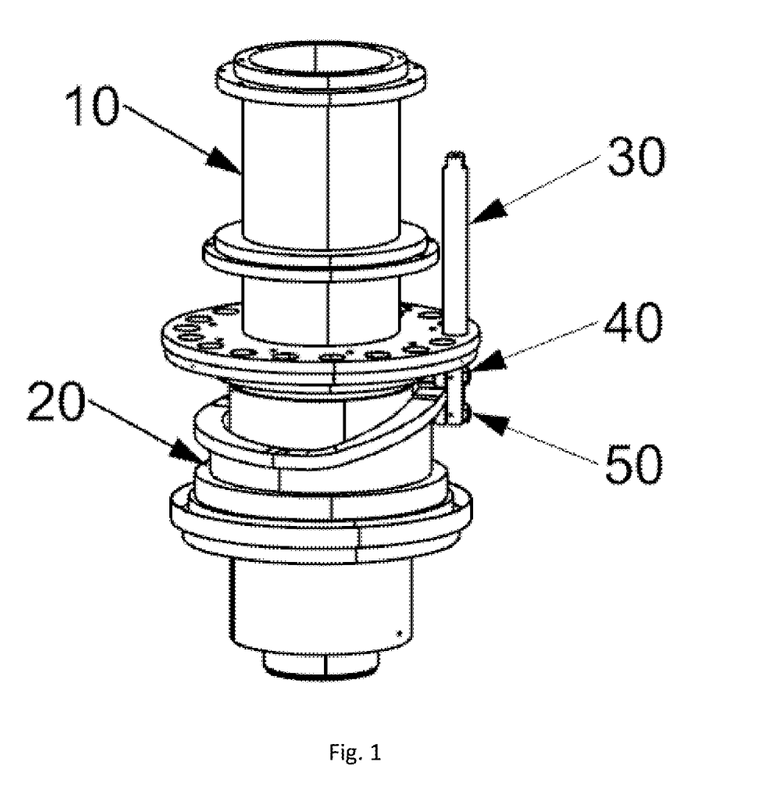
FIG. 1 is a structure schematic diagram of a cam mechanism of a cap screwing machine according to an embodiment of the present disclosure.

The following gives an application example to elaborate the design process of the cam curve:

As shown in FIG. 1, a cam mechanism of a cap screwing machine is mainly composed of a cam center shaft 10, a cam 20, a follower 30, a follower upper roller 40, a follower lower roller 50, etc. During operation, the cam 20 remains fixed, the cam center shaft 10 rotates relative to the cam 20, and the follower upper roller 40 and the follower lower roller 50 roll about the cam center shaft 10 along a cam hub to drive the cam follower 30 to move up and down along the hub.

Figure 2:
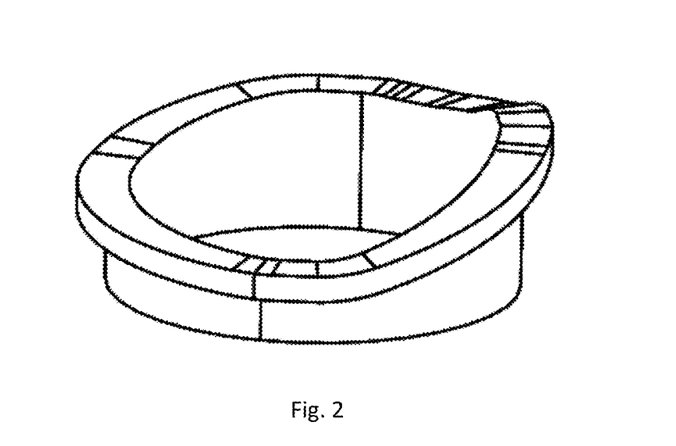
FIG. 2 is a schematic diagram of a cam in FIG. 1.
Figure 3:
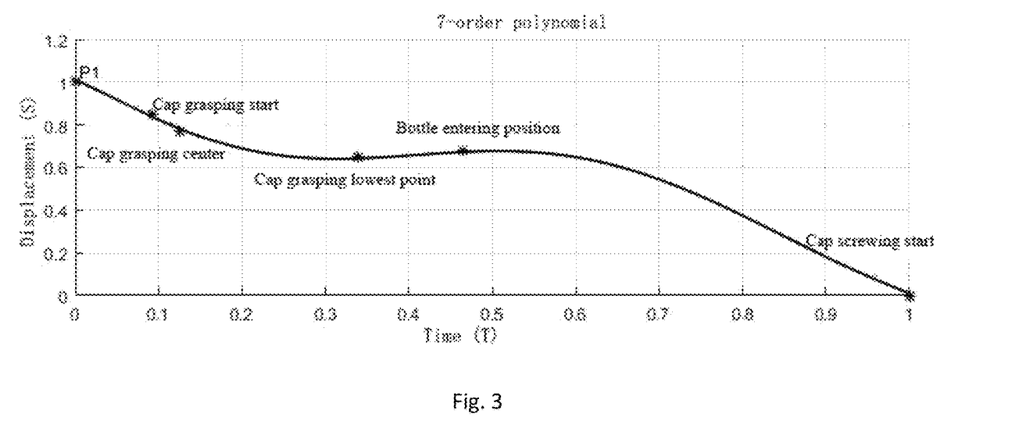
FIG. 3 is a time-displacement cam curve chart designed by a 7-order polynomial multi-objective optimization method.
Figure 4:
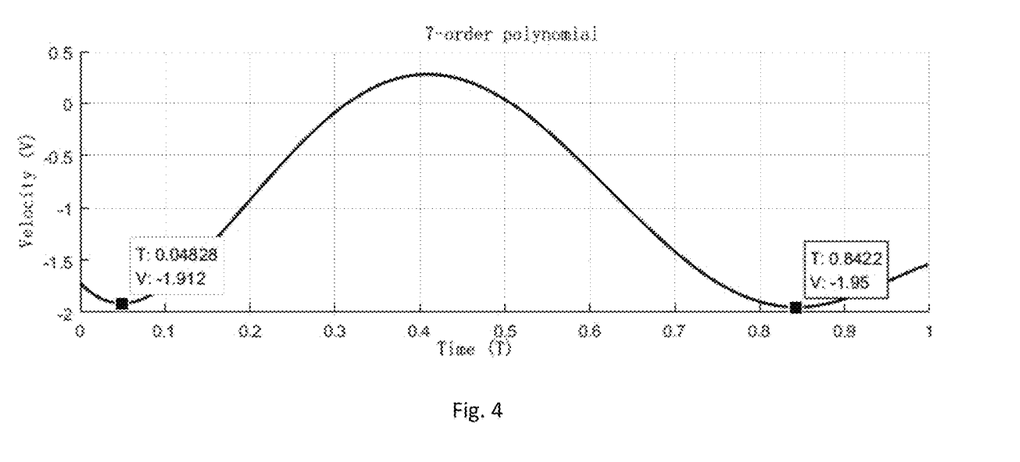
FIG. 4 is a time-velocity cam curve chart designed by a 7-order polynomial multi-objective optimization method.
Figure 5:
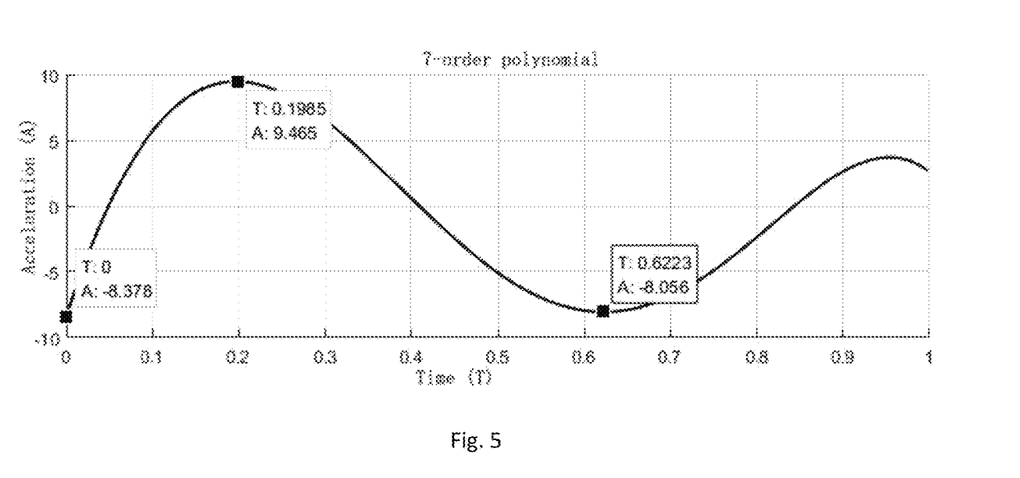
FIG. 5 is a time-acceleration cam curve chart designed by a 7-order polynomial multi-objective optimization method.
Figure 6:
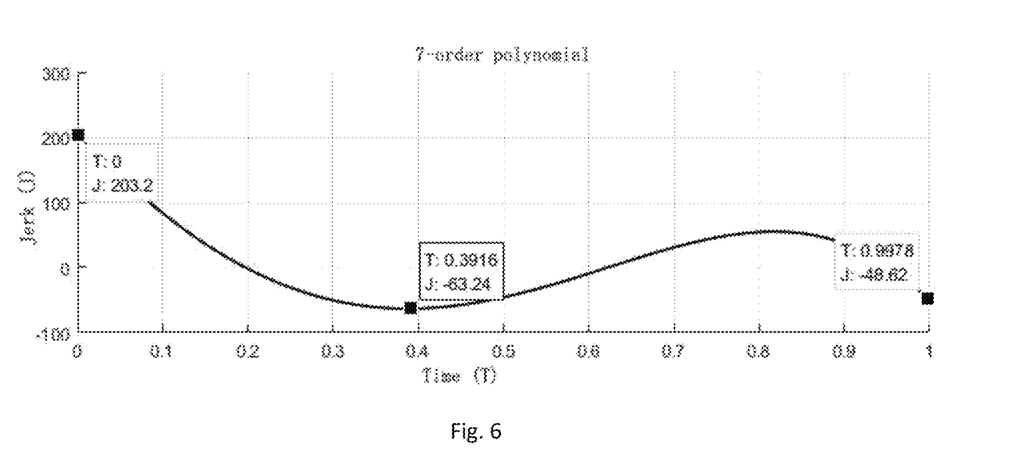
FIG. 6 is a time-jerk cam curve chart designed by a 7-order polynomial multi-objective optimization method.
Figure 7:
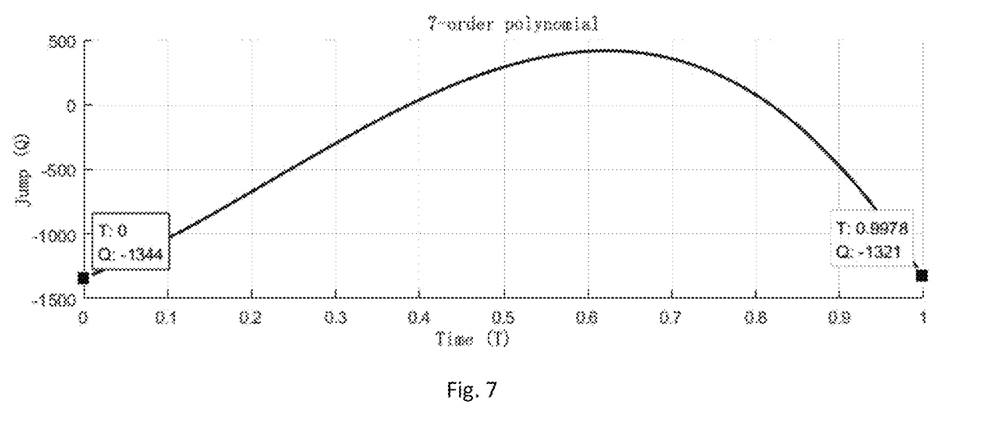
FIG. 7 is a time-jump cam curve chart designed by a 7-order polynomial multi-objective optimization method.
Figure 8:
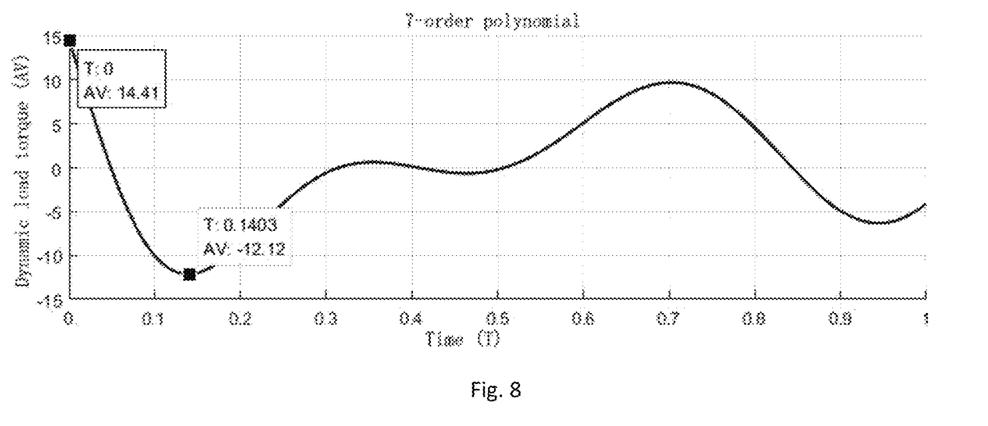
FIG. 8 is a time-dynamic load torque cam curve chart designed by a 7-order polynomial multi-objective optimization method.
Figure 9:
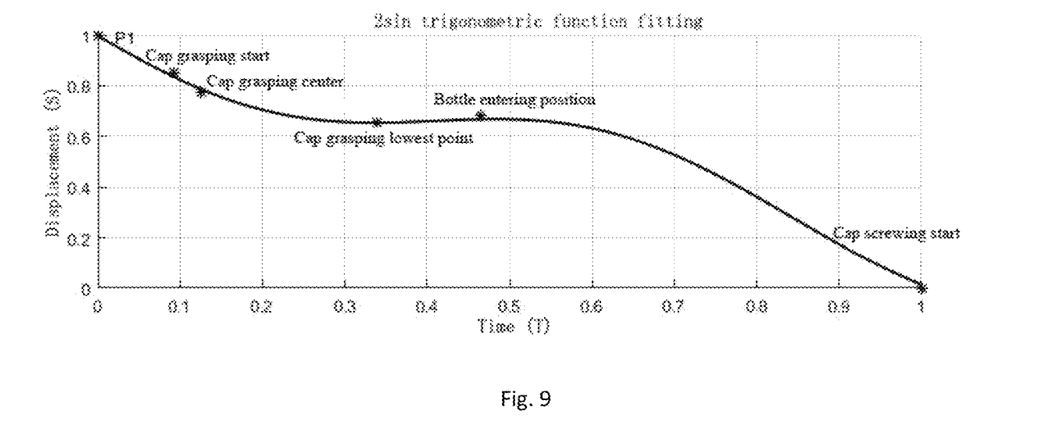
FIG. 9 is a time-displacement cam curve chart designed by an improved 2-order harmonic function multi-objective optimization method.
Figure 10:
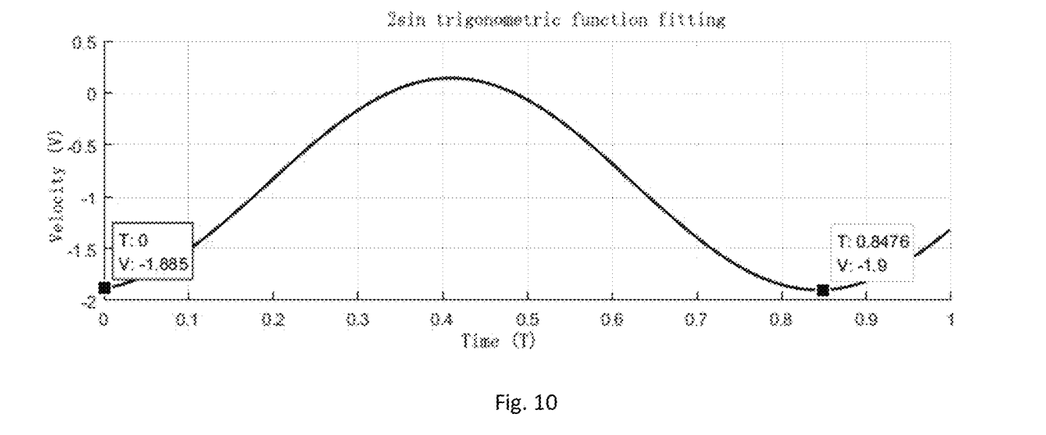
FIG. 10 is a time-velocity cam curve chart designed by an improved 2-order harmonic function multi-objective optimization method.
Figure 11:
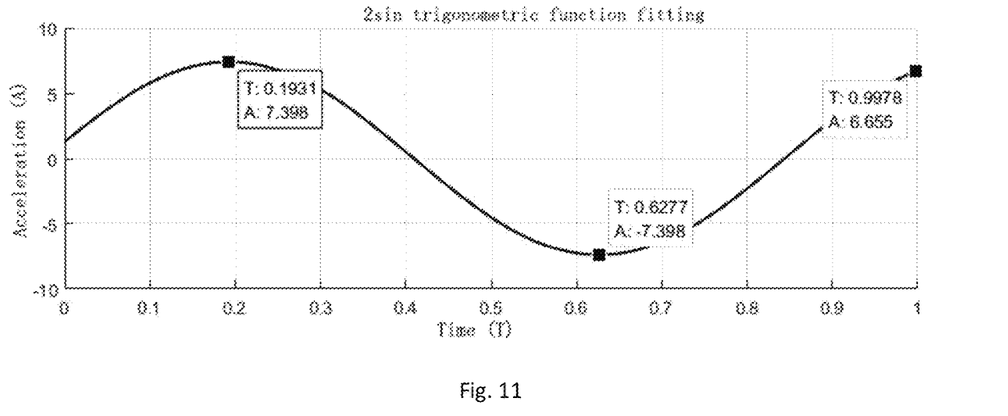
FIG. 11 is a time-acceleration cam curve chart designed by an improved 2-order harmonic function multi-objective optimization method.
Figure 12:
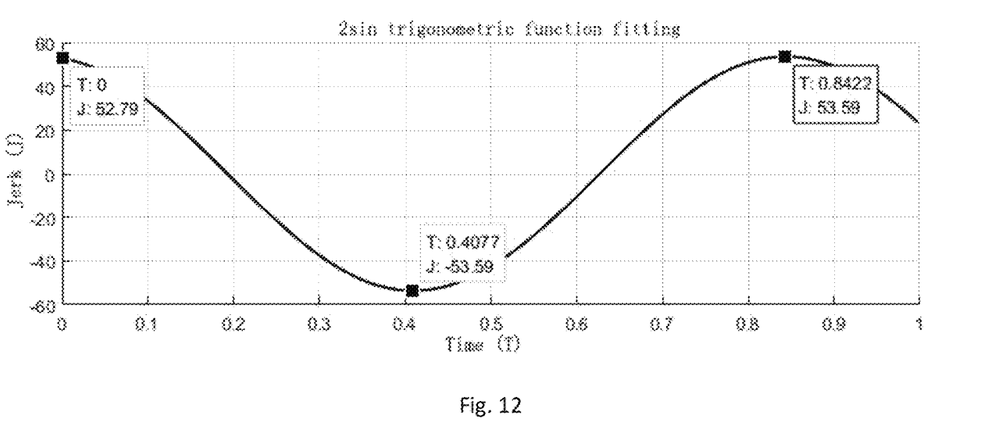
FIG. 12 is a time-jerk cam curve chart designed by an improved 2-order harmonic function multi-objective optimization method.
Figure 13:
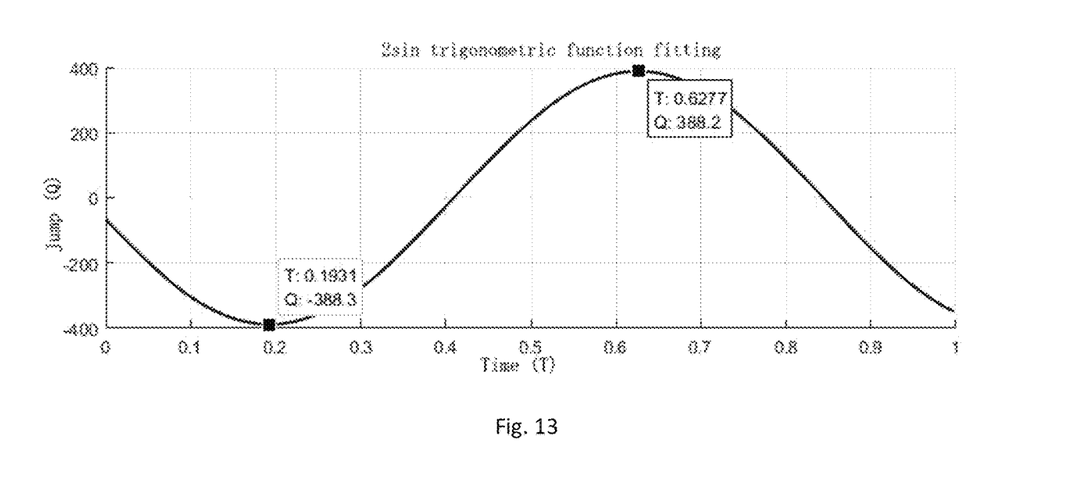
FIG. 13 is a time-jump cam curve chart designed by an improved 2-order harmonic function multi-objective optimization method.
Figure 14:
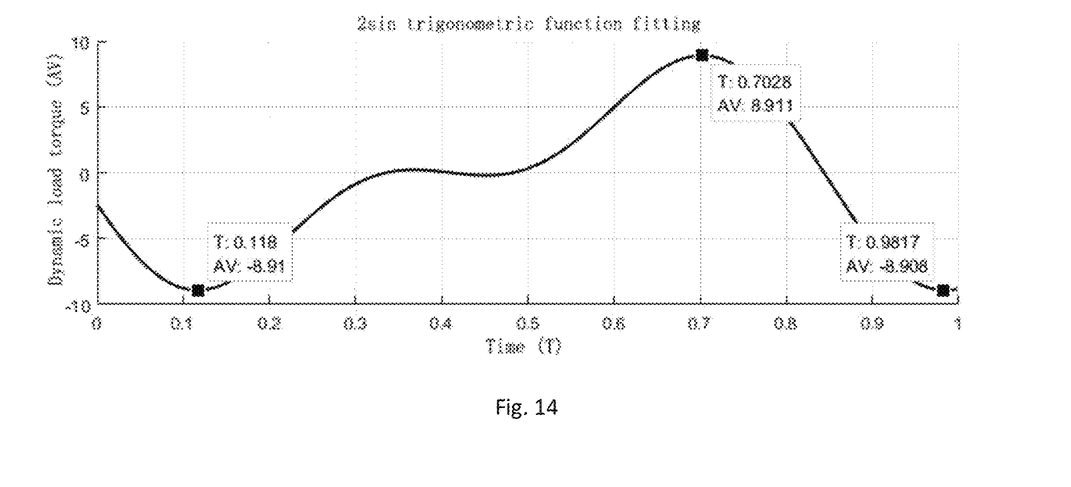
FIG. 14 is a time-dynamic load torque cam curve chart designed by an improved 2-order harmonic function multi-objective optimization method.
Figure 15:
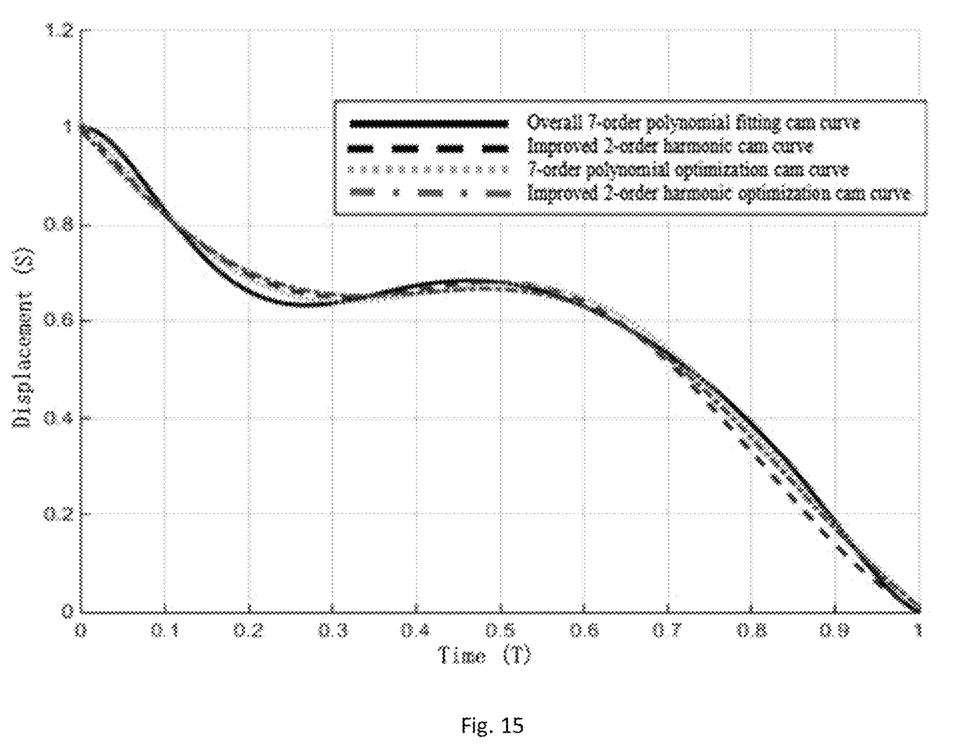
FIG. 15 is a comparison chart of time-displacement curves before and after multi-objective optimization of polynomial and harmonic cam curves according to the present disclosure.
Figure 16:
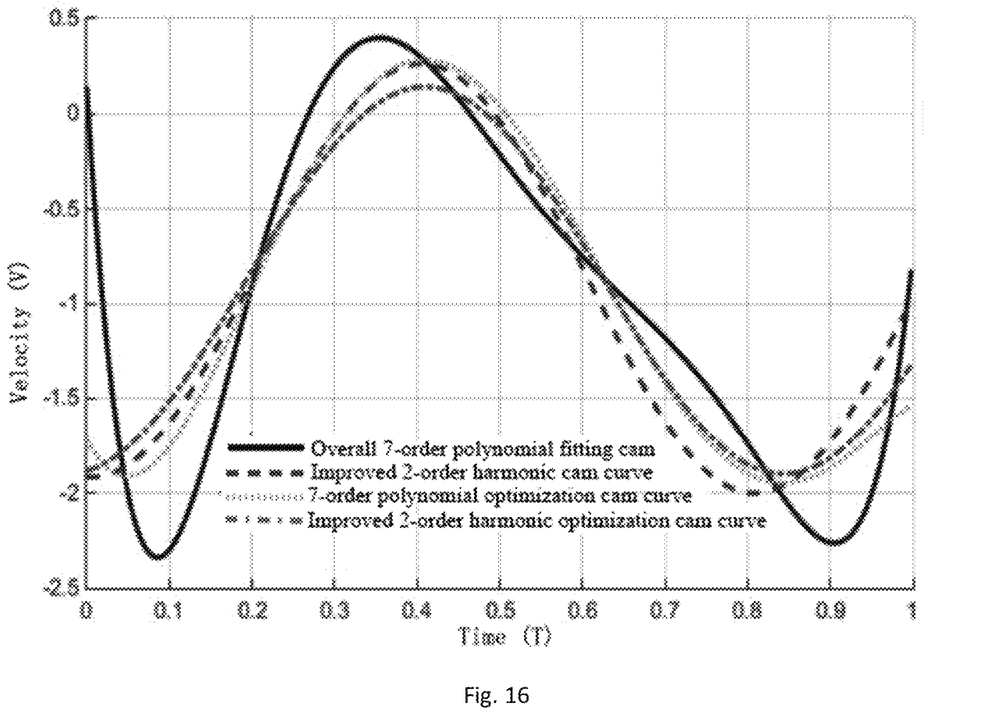
FIG. 16 is a comparison chart of time-velocity curves before and after multi-objective optimization of polynomial and harmonic cam curves according to the present disclosure.
Figure 17:
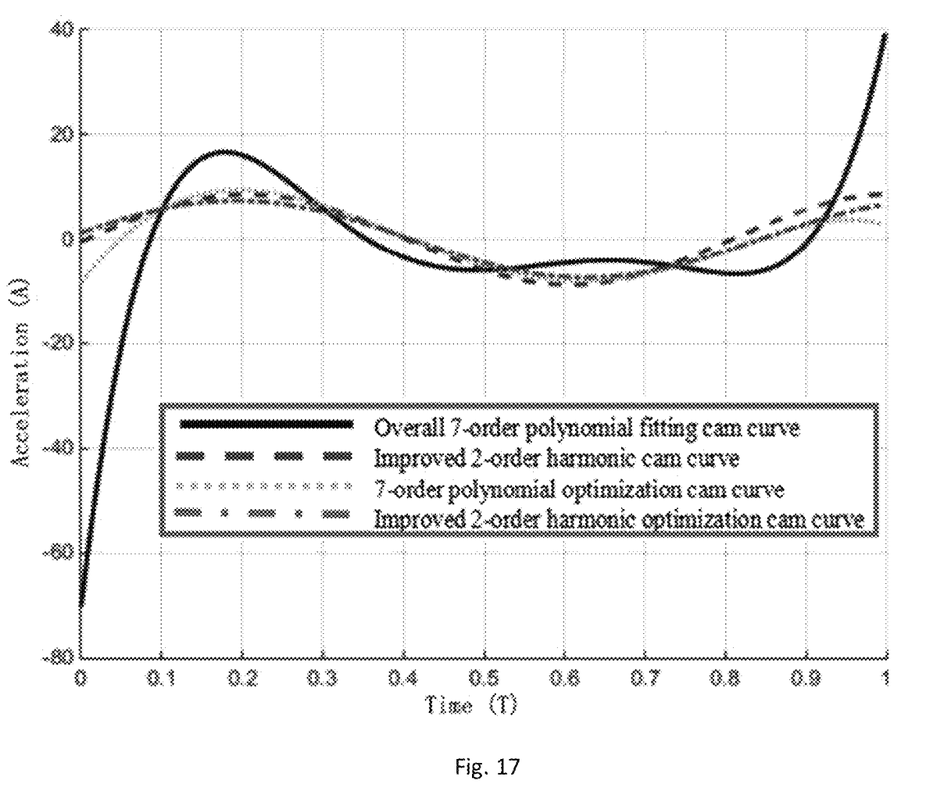
FIG. 17 is a comparison chart of time-acceleration curves before and after multi-objective optimization of polynomial and harmonic cam curves according to the present disclosure.
Figure 18:
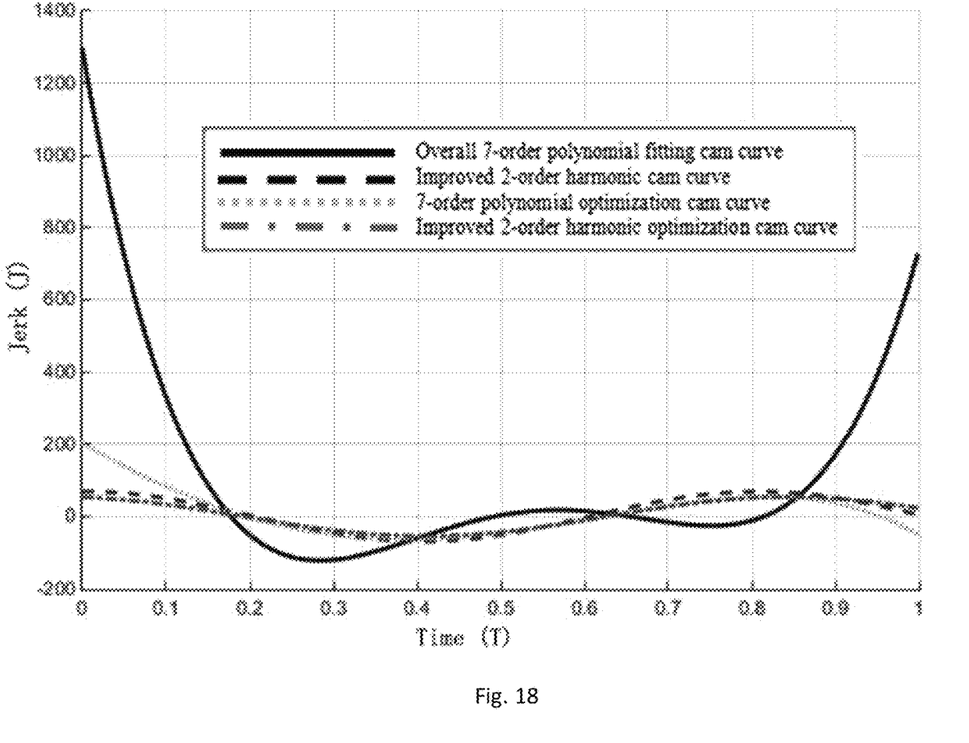
FIG. 18 is a comparison chart of time-jerk curves before and after multi-objective optimization of polynomial and harmonic cam curves according to the present disclosure.
Figure 19:
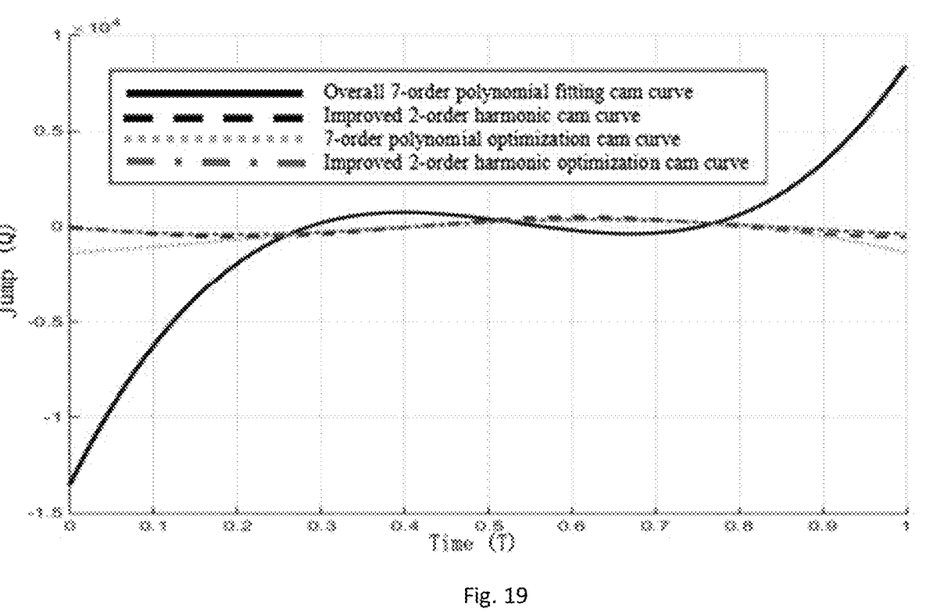
FIG. 19 is a comparison chart of time-jump curves before and after multi-objective optimization of polynomial and harmonic cam curves according to the present disclosure.
Figure 20:
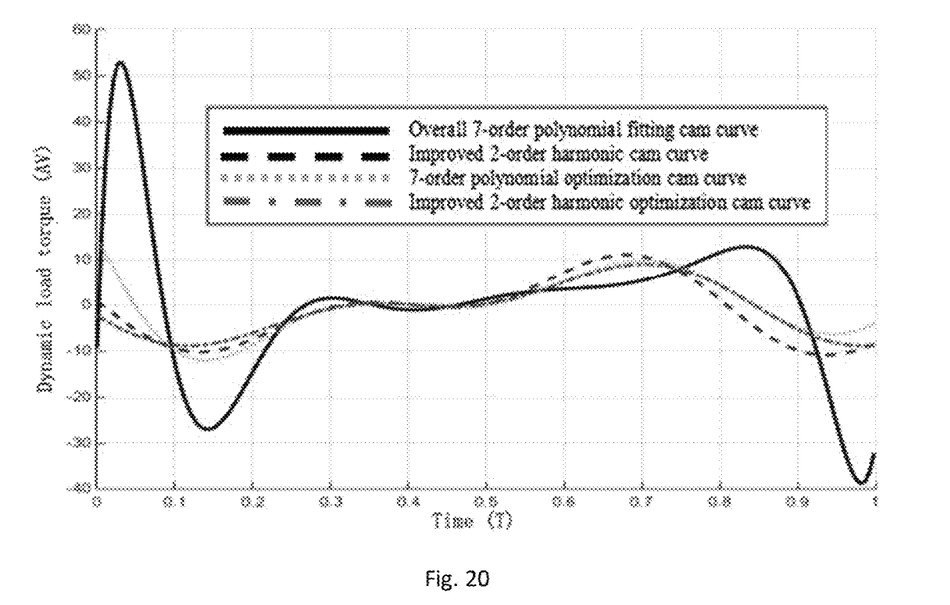
FIG. 20 is a comparison chart of time-dynamic load torque curves before and after multi-objective optimization of polynomial and harmonic cam curves according to the present disclosure.
Figure 21:
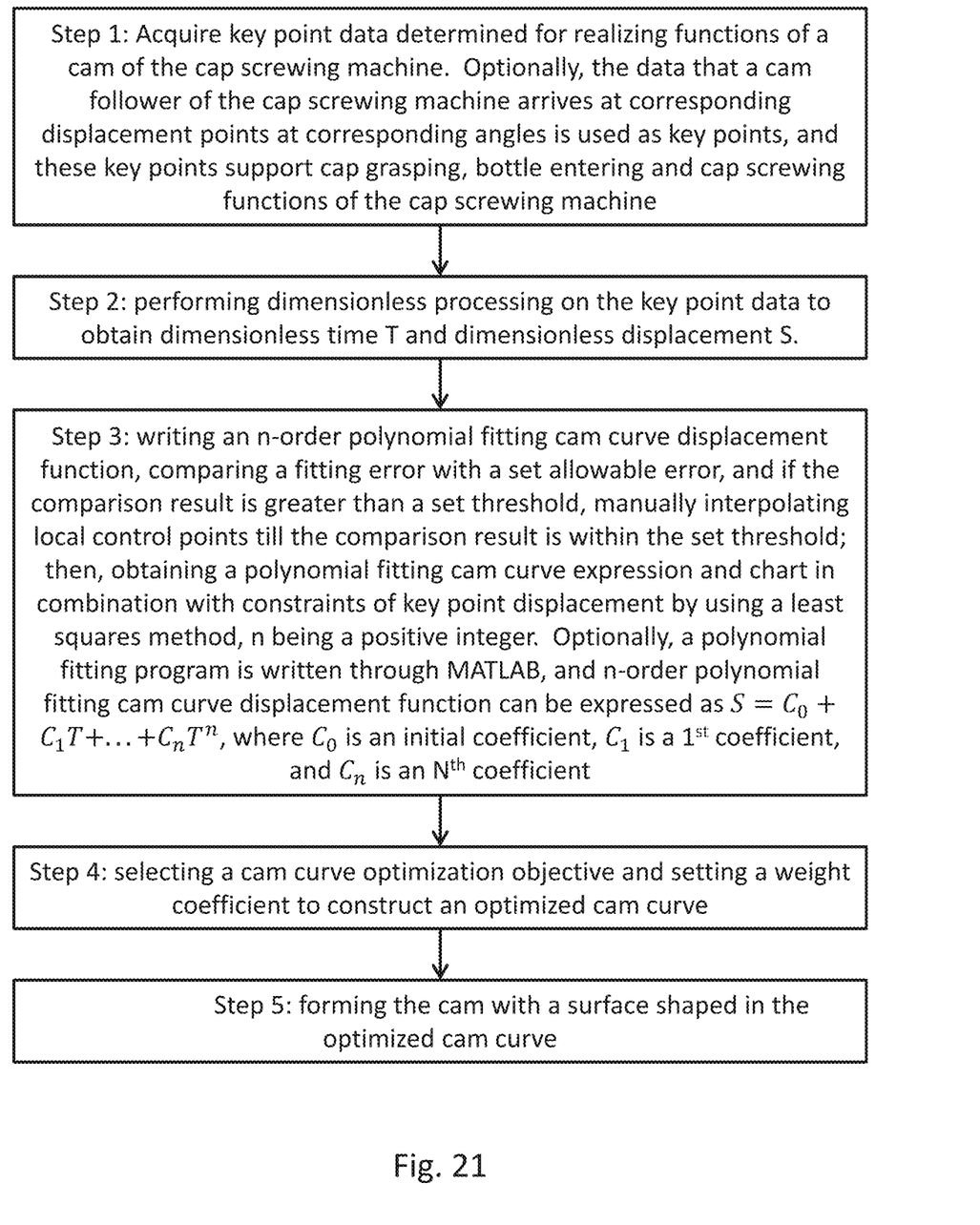
FIG. 21 is a flow chart of a method according to the present disclosure.

As shown in FIG. 2, the cam follower of the cap screwing machine needs to arrive at corresponding displacement points at corresponding angles to complete the operations from bottle leaving, cap grasping, bottle entering to cap screwing. These displacement points are referred to as key points, and the design allowable error for the key points is specified to 1 mm. The motion law is that the displacements of the cam mechanism from a bottle leaving point P1) (0°) to a point P2 (230°) till a cap screwing end point (290°) are two predetermined horizontal displacements, and the displacement from a cap screwing start point (170°) to the point P2) (230° is predetermined. The main operating period of the conventional cam is in a return period, and the cap screwing machine needs to complete the main cap grasping, bottle entering and cap screwing operations in the return period, so the design of the curve directly affects the cap screwing speed and quality of the cap screwing machine. Therefore, the cam curve from the point P1 to the cap screwing start point in the return period is mainly optimized.

According to the method described in embodiment 1, as shown in FIG. 3 to FIG. 8, a cam curve chart of the cam curve from the point P1 to the cap screwing start point is designed by using a 7-order polynomial multi-objective optimization method. A 7-order polynomial displacement curve can be written as $S=x_1+x_2T^1+x_3T^2+x_4T^3+x_5T^4+x_6T^5+x_7T^6+x_8T^7$, and the cam curve can be expressed as:

$$\begin{cases} S = x_1 + x_2T^1 + x_3T^2 + x_4T^3 + x_5T^4 + x_6T^5 + x_7T^6 + x_8T^7 \\ V = x_2 + 2x_3T^1 + 3x_4T^2 + 4x_5T^3 + 5x_6T^4 + 6x_7T^5 + 7x_8T^6 \\ A = 2x_3 + 6x_4T^1 + 12x_5T^2 + 20x_6T^3 + 30x_7T^4 + 42x_8T^5 \\ J = 6x_4 + 24x_5T^1 + 60x_6T^2 + 120x_7T^3 + 210x_8T^4 \\ Q = 24x_5 + 120x_6T^1 + 360x_7T^2 + 840x_8T^3 \\ AV = (x_2 + 2x_3T^1 + 3x_4T^2 + 4x_5T^3 + 5x_6T^4 + \\ \qquad 6x_7T^5 + 7x_8T^6) \times (2x_3 + 6x_4T^1 + 12x_5T^2 + \\ \qquad 20x_6T^3 + 30x_7T^4 + 42x_8T^5) \end{cases}$$

S is displacement, the interval of T is 0-1, x is a coefficient, $x=[x_1, x_2, x_3, x_4, x_5, x_6, x_7, x_8]$, V is velocity, A is acceleration, J is jerk, Q is jump, and AV is a dynamic load torque characteristic parameter; the cam curve optimization objectives are maximum velocity $V_{max}$, maximum acceleration $A_{max}$, maximum jerk $J_{max}$, maximum jump $Q_{max}$ and dynamic load torque characteristic parameter $AV_{max}$.

Then, $f_1(x)=V_{max}=max|V|$, $f_2(x)=A_{max}=max|A|$, $f_3(x)=J_{max}=max|J|$, $f_4(x)=Q_{max}=max|Q|$ and $f_5(x)=AV_{max}=max|AV|$. The weight coefficient of the maximum velocity $V_{max}$ and the maximum acceleration $A_{max}$ is set to 0.35, the weight coefficient of other characteristic parameters is set to 0.1, $\lambda_1=\lambda_2=0.35$, and $\lambda_3=\lambda_4=\lambda_5=0.35$.

The objective function can be written as:

$$f(x) = \sum_{j=1}^{5} \lambda_j f_j(x) \to \min.$$

The cam curve has a lower limit value $V_{max}$ which is 1, but does not have an upper limit $V_{max}$, so too large $V_{max}$ is not needed during design. The $V_{max}$ of almost all the common standard cam curves is less than 3, so in order to reduce the time required for calculation, the upper limit value $V_{max}$ of the optimization objectives can be 3. Therefore, the feasible region of $V_{max}$ is 1-3. The feasible region of other $AV_{max}$ is 4-12, the feasible region of $J_{max}$ is 30-350, the feasible region of $Q_{max}$ is 40-20,000, and the feasible region of $AV_{max}$ is 3-21. In addition, the variation range of each key point is set in order to ensure that the error of the displacement curve at each key point is not more than 1 mm. The charts show the optimized cam curve as $V_{max}=1.95$, $A_{max}=9.465$, $J_{max}=203.2$, $Q_{max}=1344$, $AV_{max}=14.41$.

By using the method described in embodiment 2, as shown in FIG. 9 to FIG. 14, a cam curve chart of the cam curve from the point P1 to the cap screwing start point is designed by using an improved 2-order harmonic optimization method. The displacement function of the harmonic cam curve from the point P1 to the cap screwing start point can be expressed as:

$$S=x_1 \sin(x_2T+x_3)+x_4 \sin(x_5T+x_6).$$

An improved 2-order harmonic optimization cam curve can be obtained according to the 7-order polynomial cam curve optimization method:

$$\begin{cases} S = 100\sin(0.008791T + 3.1314) + \\ \qquad 0.14096\sin(7.2444T + 3.3152) \\ V = 0.87912\cos(0.008791T + 3.1314) + \\ \qquad 1.021171\cos(7.2444T + 3.3152) \\ A = -0.007729\sin(0.008791T + 3.1314) - \\ \qquad 7.397768\sin(7.2444T + 3.3152) \\ J = -0.000068\cos(0.008791T + 3.1314) - \\ \qquad 53.592394\cos(7.2444T + 3.3152) \\ Q = 0.0000006\sin(0.008791T + 3.1314) + \\ \qquad 388.244738\sin(7.2444T + 3.3152) \end{cases}$$

The charts show the optimized cam curve as $V_{max}=1.9$, $A_{max}=7.396$, $J_{max}=53.59$, $Q_{max}=388.2$, $AV_{max}=8.932$.

As shown in FIG. 15 to FIG. 20, it can be found by comparing the cam curve of 7-order polynomial optimization and the cam curve of improved 2-order harmonic optimization with the curves before optimization that the performance of the 7-order polynomial fitting cam curve before optimization is worst, the fluctuation of various characteristic values is large, but after the overall 7-order polynomial fitting cam curve is optimized, the maximum velocity $V_{max}$ is reduced from 2.34 to 1.95 by 16.67%; the maximum acceleration $A_{max}$ is reduced from 69.91 to 9.465 by 86.5%; the maximum jerk $J_{max}$ is reduced from 1292 to 203.2 by 84.27%; the maximum jump $Q_{max}$ is reduced from 13450 to 1344 by 90%; and the dynamic load torque characteristic parameter $AV_{max}$ is reduced from 52.93 to 14.41 by 72.78%. All the characteristic parameters are reduced greatly, where the maximum jump $Q_{max}$ is even reduced by 90%, so the kinematic and dynamic performance is improved obviously. After the improved 2-order harmonic cam curve is optimized, the maximum velocity $V_{max}$ is reduced from 2.002 to 1.9 by 5.09%; the maximum acceleration $A_{max}$ is reduced from 8.806 to 7.398 by 16.0%; the maximum jerk $J_{max}$ is reduced from 68.34 to 53.59 by 21.58%; the maximum jump $Q_{max}$ is reduced from 533 to 388.3 by 27.15%; and the dynamic load torque characteristic parameter $AV_{max}$ is reduced from 10.98 to 8.911 by 18.84%. All the characteristic parameters are reduced less than those of the polynomial cam curve but still reduced a lot, where the maximum jump $Q_{max}$ is even reduced by 27.15%, so the kinematic and dynamic performance is improved relatively obviously. Finally, the optimized improved 2-order harmonic cam curve is regarded as an optimal cam curve, a three-dimensional model thereof can be imported into a UG machining module to generate a machining locus, and the machining of the cam of the cap screwing machine is completed on a machining center.

Therefore, the multi-objective optimization method of the present disclosure is very effective for the design of the cam curve. In the actual engineering design, the objectives can be endowed with different weight optimization cam curves according to different importance of the optimization objectives and different engineering conditions.

Since the cam curve continuity of the cam designed by the method of the present disclosure is improved, when the rotation speed is improved, the mechanism will not vibrate violently, and the production efficiency of the cap screwing machine is greatly improved. Taking the cam mechanism of the cap screwing machine in the specific embodiment as an example, after the rotation speed is improved, the cap screwing ability of a single cap screwing head of the cap screwing machine is improved from original 1,800 to 2,600 per hour, and the cap screwing efficiency is improved by 30.8%. Since the cam mechanism is designed with 18 cap screwing heads, 46,800 beverage bottle caps can be screwed per hour on a production line, which will bring considerable benefits to the beverage filling enterprises.

The method of the present disclosure is not only limited to the cam of the cap screwing machine, and is applicable to cams in packaging machines such as filling machines and bottle blowing machines. The cam curve design method of the present disclosure can greatly improve the operating performance of a mechanical system, effectively control the unfavorable factors such as noise and vibration during the operation of the machine and improve the operating efficiency under the premise of high-speed driving of the machine.

What is claimed is:
1. A method to design a cam curve for a cap screwing machine based on a multi-objective method, comprising the following steps:
   step 1: acquiring key point data determined for realizing functions of a cam of the cap screwing machine;
   step 2: performing dimensionless processing on the key point data to obtain dimensionless time T and dimensionless displacement S;
   step 3: writing an n-order polynomial fitting cam curve displacement function, comparing a fitting error with a set allowable error, and if the comparison result is greater than a set threshold, manually interpolating local control points till the comparison result is within the set threshold; then, obtaining a polynomial fitting cam curve expression and chart in combination with constraints of key point displacement by using a least squares method, n being a positive integer; and
   step 4: selecting a cam curve optimization objective and setting a weight coefficient to construct an optimized cam curve;
   step 5: machining the cam with a surface shaped in the optimized cam curve.
2. The method to design a cam curve for a cap screwing machine based on a multi-objective method according to claim 1, wherein in step 1, data that a cam follower of the cap screwing machine arrives at corresponding displacement points at corresponding angles is used as key points, and these key points support cap grasping, bottle entering and cap screwing functions of the cap screwing machine.
3. The method to design a cam curve for a cap screwing machine based on a multi-objective method according to claim 1, wherein in step 3, a polynomial fitting program is written through MATLAB, and n-order polynomial fitting cam curve displacement function is expressed as $S=C_0+C_1 T+\ldots+C_n T^n$, where $C_0$ is an initial coefficient, $C_1$ is a 1st coefficient, and $C_n$ is an $N^{th}$ coefficient.

* * * * *